(12) United States Patent
Tschumakow et al.

(10) Patent No.: US 10,998,279 B2
(45) Date of Patent: May 4, 2021

(54) ON-CHIP INTEGRATED CAVITY RESONATOR

(71) Applicant: Infineon Technologies AG, Neubiberg (DE)

(72) Inventors: Dmitri Alex Tschumakow, Dresden (DE); Claus Dahl, Dresden (DE)

(73) Assignee: Infineon Technologies AG, Neubiberg (DE)

(*) Notice: Subject to any disclaimer, the term of this patent is extended or adjusted under 35 U.S.C. 154(b) by 22 days.

(21) Appl. No.: 16/113,525

(22) Filed: Aug. 27, 2018

(65) Prior Publication Data

US 2020/0066661 A1 Feb. 27, 2020

(51) Int. Cl.
| | |
|---|---|
| *H01L 23/66* | (2006.01) |
| *H01P 7/06* | (2006.01) |
| *H01P 11/00* | (2006.01) |
| *G01J 3/28* | (2006.01) |
| *H01L 21/308* | (2006.01) |

(Continued)

(52) U.S. Cl.
CPC .............. *H01L 23/66* (2013.01); *H01P 7/065* (2013.01); *H01P 11/008* (2013.01); *G01J 3/2803* (2013.01); *G01N 22/00* (2013.01); *H01L 21/308* (2013.01); *H01L 21/31144* (2013.01); *H01L 21/32051* (2013.01); *H01L 21/32139* (2013.01); *H01L 2223/6627* (2013.01); *H01L 2223/6677* (2013.01); *H01Q 13/10* (2013.01)

(58) Field of Classification Search
CPC . H01L 23/66; H01L 21/308; H01L 21/31144; H01L 21/32139; H01L 21/3205; H01L 2223/6627; H01L 2223/6677; H01P 7/065; H01P 11/008; G01J 3/2803; G01N 22/00; H01Q 13/10
See application file for complete search history.

(56) References Cited

U.S. PATENT DOCUMENTS 7,248,131 B2 * 7/2007 Fazzio ................ B81C 1/00246
257/416
2008/0283944 A1 11/2008 Geefay
(Continued)

FOREIGN PATENT DOCUMENTS

| CN | 107244645 | 10/2017 |
|---|---|---|
| JP | 2004048273 | 2/2004 |

(Continued)

OTHER PUBLICATIONS

Gerecht et al., "Chirped-pulse terahertz spectroscopy for broadband trace gas sensing", https://ws680.nist.gov/publication/get_pdf.cfm?pub_id=907773, May 15, 2011, 12 pages.

*Primary Examiner* — Dale E Page
*Assistant Examiner* — Quovaunda Jefferson
(74) *Attorney, Agent, or Firm* — Harrity & Harrity, LLP

(57) ABSTRACT

A semiconductor chip may include high frequency electrical circuitry. The semiconductor chip may include a cavity resonator integrated with the high frequency electrical circuitry in a semiconductor substrate of the semiconductor chip. The cavity resonator may include a resonator body in a cavity in the semiconductor substrate of the semiconductor chip. The resonator body may comprise a metal layer. The cavity resonator may include a feeding structure electrically connected to the high frequency electrical circuitry.

20 Claims, 11 Drawing Sheets

(51) Int. Cl.
*H01L 21/311* (2006.01)
*H01L 21/3213* (2006.01)
*H01L 21/3205* (2006.01)
*G01N 22/00* (2006.01)
*H01Q 13/10* (2006.01)

(56) References Cited

U.S. PATENT DOCUMENTS

2011/0260297 A1* 10/2011 Lin .................. H01L 24/05
  257/621
2015/0298965 A1* 10/2015 Tsai .................. B81C 1/00182
  257/415
2016/0363609 A1   12/2016 Wygant et al.

FOREIGN PATENT DOCUMENTS

| KR | 2002-0078789 | * 10/2002 |
| WO | WO 03056657 | 7/2003 |
| WO | WO 2015191719 | 12/2015 |

* cited by examiner

300

ON-CHIP INTEGRATED CAVITY RESONATOR

BACKGROUND

A cavity resonator includes a resonator body (e.g., a hollow or dielectric-filled metallic structure) and a feeding structure. In operation, the feeding structure feeds electromagnetic waves into the resonator body, and the resonator body contains the electromagnetic waves as the electromagnetic waves reflect back and forth between walls of the resonator body (i.e., within a cavity of the resonator body). Standing waves are formed in the cavity when the electromagnetic waves are at a resonant frequency of the cavity resonator, which causes the cavity resonator to oscillate at the resonant frequency.

SUMMARY

According to some possible implementations, a semiconductor chip may include: high frequency electrical circuitry; and a cavity resonator integrated with the high frequency electrical circuitry in a semiconductor substrate of the semiconductor chip, the cavity resonator comprising: a resonator body in a cavity in the semiconductor substrate of the semiconductor chip, wherein the resonator body comprises a metal layer, and a feeding structure electrically connected to the high frequency electrical circuitry.

According to some possible implementations, a method may include etching a cavity in a first surface of a semiconductor substrate; providing a first layer on surfaces of the semiconductor substrate that define the cavity; depositing a metal layer on the first layer, wherein the metal layer forms a portion of a body of the cavity resonator; and providing a feeding structure of the cavity resonator.

According to some possible implementations, a cavity resonator may include: a resonator body comprising an interior portion that is at least partially filled with an insulation material, wherein the resonator body is arranged in a cavity in a semiconductor substrate; an insulation layer arranged between the resonator body and a surface of the semiconductor substrate that defines the cavity; and a feeding structure formed in the semiconductor substrate to feed a high frequency signal to the cavity resonator, wherein the feeding structure is connected to high frequency electrical circuitry that is arranged on the semiconductor substrate, wherein the high frequency electrical circuitry and the cavity resonator are integrated in a same integrated circuit.

DETAILED DESCRIPTION

Figure 1A:
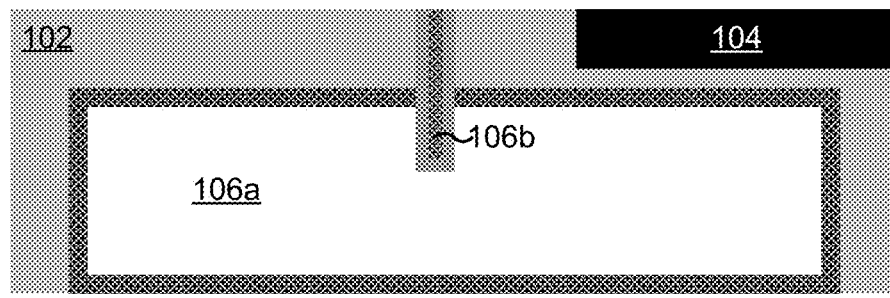
FIGS. 1A and 1B are diagrams of example implementations described herein.

The following detailed description of example implementations refers to the accompanying drawings. The same reference numbers in different drawings may identify the same or similar elements.

When using an LC circuit design, it is difficult or impossible to manufacture a high frequency oscillation circuit with a high quality factor (Q-factor) (e.g., a Q-factor equal to or greater than approximately 100). Unfortunately, such a high Q-factor may be needed for an oscillator to achieve low phase noise values, for a filter to achieve a high selectivity value, and/or the like. For applications at or above approximately 10 GHz, a high Q-factor can be achieved with a cavity resonator. As an example, in an application the requires a frequency in the millimeter wave (mmW) range at or above approximately 100 GHz, a Q-factor of at least 100 can be achieved by using a cavity resonator. As another example, for an application that requires a frequency in the terahertz (THz) range, a cavity resonator may be the only way to achieve a Q-factor that is significantly higher than 100. Such an application may include, for example, a gas or liquid spectroscopy application.

In some cases, an external cavity resonator can be used in a given circuit. In such a case, a discrete cavity resonator is formed, and is subsequently bonded or attached to circuitry designed to provide electromagnetic signals to the cavity resonator at high frequencies. However, such a solution is not ideal due to the amount of physical space required for these discrete components, as well as the increase to manufacturing and assembly complexity.

Some implementations described herein provide a cavity resonator that is integrated with high frequency electrical circuitry on a single semiconductor chip. Such a cavity resonator is herein referred to as an integrated cavity resonator. In some implementations, an operable frequency range of a circuit formed by the high frequency electrical circuitry and the integrated cavity resonator may be between approximately 10 GHz and approximately 10 THz. As such, the integrated cavity resonator can be used in an application that requires a frequency above approximately 10 GHz while achieving a high Q-factor (e.g., a Q-factor of at least approximately 100).

Additionally, since the integrated cavity resonator is on the same semiconductor chip as the high frequency electrical circuitry, the integrated cavity resonator reduces the amount of physical space required for such a circuit, and reduces manufacturing and assembly complexity (e.g., as compared to a circuit that uses a discrete cavity resonator).

Further, in some implementations, the integrated cavity resonator may be adapted for use in an integrated spectroscopic sensor that may require operation at frequencies from several GHz and up into a THz range. Such an integrated spectroscopic sensor could be used in, for example, an air quality monitoring application, an exhaust monitoring application, a medical application, and many others. A conventional setup for such a spectroscopic application typically requires a large waveguide (e.g., waveguide with dimensions on the order of meters). However, with the integrated cavity resonator, there is amplification of an oscillation amplitude, and energy in the integrated cavity resonator is condensed at a comparatively smaller volume. This means that, for a given amount of energy, the amplitude per volume is increased significantly and, as such, a large waveguide is not needed. Thus, an integrated spectroscopic sensor can be formed using the integrated cavity resonator, as described in further detail below.

Figure 1B:
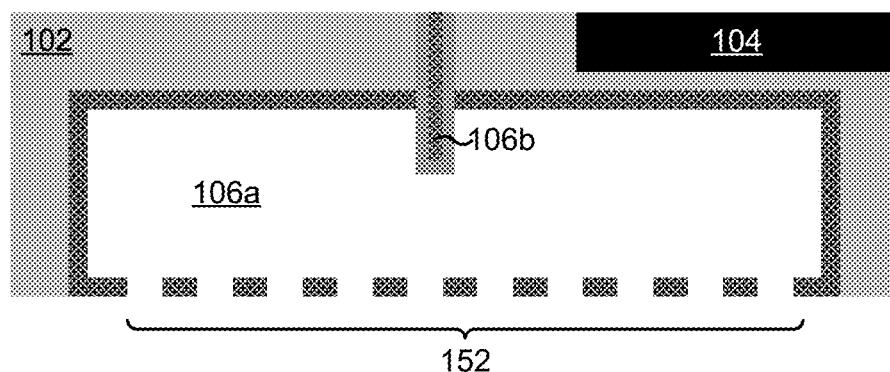

FIGS. 1A and 1B are diagrams of example implementations 100 and 150 described herein. FIG. 1A is a diagram of an example semiconductor chip 100 including an integrated cavity resonator. Semiconductor chip 100 may form, for example, a high frequency oscillation circuit that generates a high frequency electrical signal (e.g., an electrical signal with a frequency between approximately 10 GHz and approximately 10 THz). As shown in FIG. 1A, semiconductor chip 100 may include a semiconductor substrate 102 that includes high frequency electrical circuitry 104 and a cavity resonator 106 including a resonator body 106a and a feeding structure 106b. As shown, cavity resonator 106 is integrated with high frequency electrical circuitry 104 in semiconductor substrate 102 of semiconductor chip 100 (i.e., cavity resonator 106 and high frequency electrical circuitry are integrated in the same integrated circuit). As shown, in some implementations, cavity resonator 106 may be arranged on an opposite side of semiconductor substrate 102 from high frequency electrical circuitry 104.

In some implementations, resonator body 106a may be formed in a cavity in semiconductor substrate 102. For example, a cavity may be formed in a back side surface (e.g., a bottom surface, a surface opposite from that on or in which high frequency electrical circuitry 104 is formed) of semiconductor substrate 102, and resonator body 106a (e.g., comprising a metal layer) may be formed in the cavity, an example of which is described below. While not shown in FIG. 1A, feeding structure 106b may be electrically connected to high frequency electrical circuitry 104 in association with feeding a high frequency signal to feeding structure 106b of cavity resonator 106.

In some aspects, cavity resonator 106 and/or semiconductor may include one or more additional layers and/or materials, such as an insulation layer between semiconductor substrate 102 and resonator body 106a, an insulation material that at least partially fills an interior portion of resonator body, and/or the like, examples of which are provided below.

FIG. 1B is a diagram of an example semiconductor chip 150. Semiconductor chip 150 may be included in, for example, a spectroscopic sensor that requires operation at a frequency up to the THz range (e.g., a spectroscopic sensor for use in a gas or a liquid spectroscopy application).

As shown in FIG. 1B, semiconductor chip 150 may be similar to semiconductor chip 100, but may further including one or more openings 152. In some implementations, the one or more openings 152 allow a medium (e.g., a gas, a liquid, and/or the like) to enter the interior portion of resonator body 106a of cavity resonator 106. In some implementations, penetration of the interior portion of resonator body 106a by the medium (via the one or more openings 152) provides functionality associated with detecting or sensing the medium (e.g., in parts per billion, parts per million) by means of THz spectroscopy.

As indicated above, FIGS. 1A and 1B are provided merely as examples. Other examples are possible and may differ from what was described with regard to FIGS. 1A and 1B.

Figure 2A:
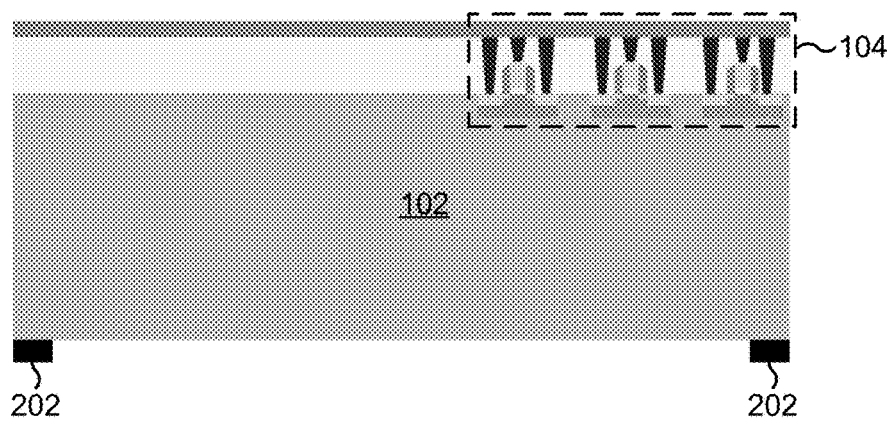
FIGS. 2A-2BB are diagrams associated with an example implementation of an integrated cavity resonator in a semiconductor substrate of a semiconductor chip.
Figure 2B:
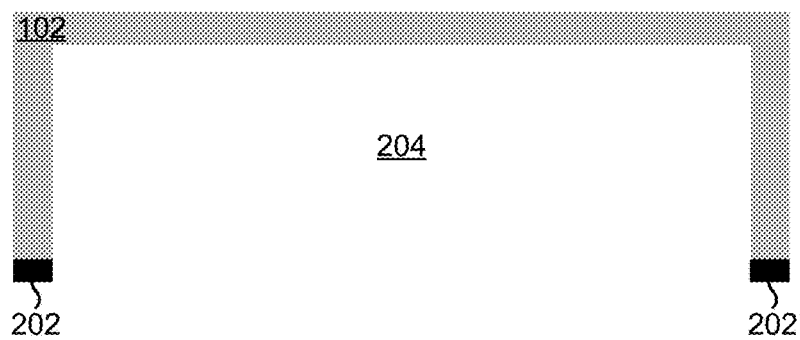
Figure 2C:
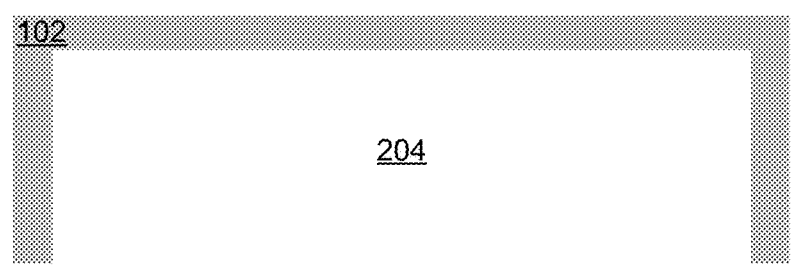

FIGS. 2A-2BB are diagrams associated with an example implementation 200 of semiconductor chip 100. The device associated with FIGS. 2A-2BB is herein referred to as semiconductor chip 200. FIGS. 2A-2Z depict example process steps for forming cavity resonator 106 (including resonator body 106a and feeding structure 106b) in a semiconductor substrate 102 of semiconductor chip 200.

As shown in FIG. 2A, semiconductor substrate 102 is provided. In some implementations, semiconductor substrate 102 can comprise silicon, or another semiconductor material. As further shown, high frequency electrical circuitry 104 can be provided on a first surface (e.g., a surface on a front side) of semiconductor substrate 102. High frequency electrical circuitry 104 may include one or more components associated with feeding a high frequency electrical signal to cavity resonator 106 of semiconductor chip 200. For example, high frequency electrical circuitry 104 can include one or more front end electrical components of semiconductor chip 200, such as one or more transistors, one or more resistors, and/or the like.

In some implementations, high frequency electrical circuitry 104 can be provided at least partially before a time at which cavity resonator 106 is formed in semiconductor substrate 102 and/or at least partially after the time at which cavity resonator 106 is formed in semiconductor substrate 102. In some implementations, high frequency electrical circuitry is not completely processed, but may be partially processed prior to formation of cavity resonator 106, as described below.

In some implementations, as shown in FIG. 2A, the surface on the front side of semiconductor chip 200 can be planarized and sealed in order to enable back side processing without damaging high frequency electrical circuitry 104.

Notably, high frequency electrical circuitry 104 is shown in FIG. 2A as including a set of CMOS transistors, and their associated contacts, while metallic interconnect layers are not shown. However, in practice, high frequency electrical circuitry 104 may include metallic interconnect layers, a different number of components, different components, and/or differently arranged components than those illustrated in FIG. 2A. Further, for purposes of simplicity (e.g., since the presence of high frequency electrical circuitry 104 does not change the backside processing steps described below), high frequency electrical circuitry 104 is not shown in FIGS. 2B-2BB. Nonetheless, presence of high frequency electrical circuitry 104 can be assumed.

As further shown in FIG. 2A, a mask 202 (e.g., a lithographic mask) is applied to a second surface (e.g., the surface on the back side) of semiconductor substrate 102. Mask 202 defines boundaries of a cavity that will be etched into semiconductor substrate 102.

As shown in FIG. 2B, a cavity 204 is etched in semiconductor substrate 102 (e.g., in the area that is not masked by masked 202). In some implementations, a length of cavity 204 or a width of cavity 204 may be in a range from approximately 10 micrometers (μm) to approximately 5 millimeters (mm), and a height of cavity 204 (i.e., an etch depth) may be in a range from approximately 1 μm to approximately 2 mm. In some implementations, the depth of cavity 204 may be between approximately one-half of a thickness of semiconductor substrate 102 and approximately three-quarters of the thickness of semiconductor substrate 102. In general, a size (e.g., a length, a width, and/or a depth) of cavity 204 may be selected depending on requirements of cavity resonator 106 in the application for which semiconductor chip 200 is to be used. As shown in FIG. 2C, mask 202 is removed after cavity 204 is formed in semiconductor substrate 102.

Figure 2D:
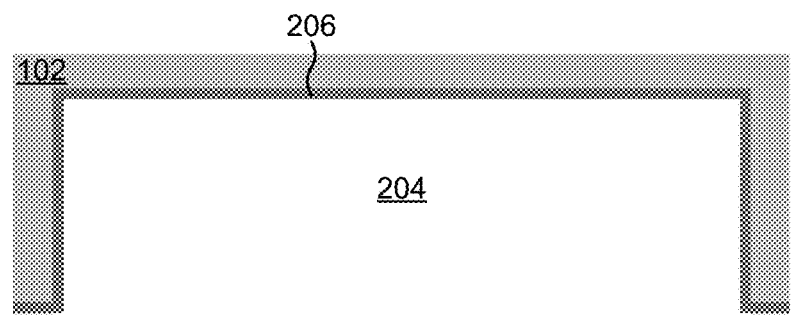

As shown in FIG. 2D, an insulation layer 206 is applied to at least surfaces of semiconductor substrate 102 that define cavity 204. In some implementations, insulation layer 206 is a layer that prevents interaction (e.g., migration and/or chemical reaction) of semiconductor substrate 102 and a metal layer (deposited on insulation layer 206, as described below). In some implementations, insulation layer 206 may comprise, for example, silicon oxide or another dielectric material. In some implementations, a thickness of insulation layer 206 may be in a range from approximately 5 nm to approximately 50 μm, such as 1 μm.

Figure 2E:
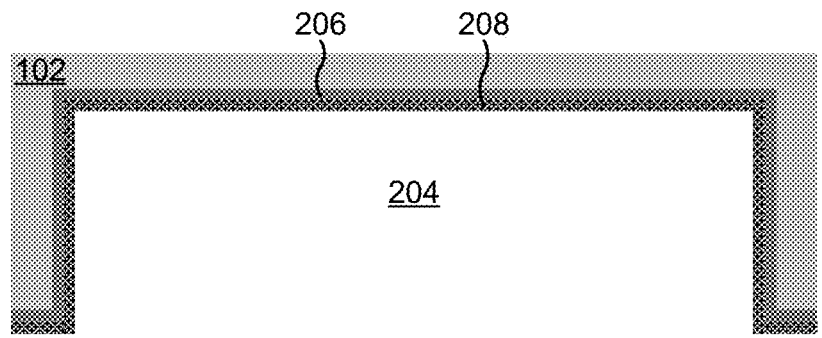

As shown in FIG. 2E, a metal layer 208 is deposited on insulation layer 206 at least within cavity 204. In some implementations, metal layer 208 may comprise a metal or metallic material, such as copper, aluminum, tantalum, tungsten, titanium, silver, gold, and/or the like. As shown and described below, metal layer 208 may form a portion of resonator body 106a. In some implementations, a thickness of metal layer 208 may be in a range from approximately 50 nm to approximately 50 µm, such as 1 µm.

Figure 2F:
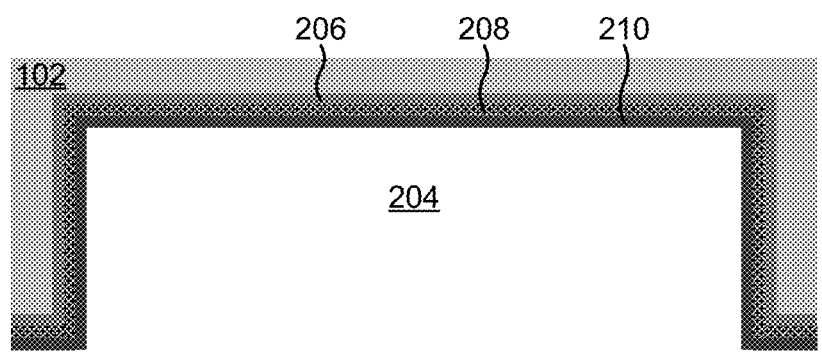

As shown in FIG. 2F, an insulation layer 210 is formed on metal layer 208 at least within cavity 204. In some implementations, insulation layer 210 may comprise a dielectric material (or another suitable insulation material), and may differ from insulation layer 206. For example, if insulation layer 206 comprises silicon oxide, then insulation layer 210 may comprise silicon nitride. In some implementations, this difference in material may be used in order to enable selective etching of insulation layer 206 without etching insulation layer 210 and/or selective etching of insulation layer 210 without etching insulation layer 206, as described below. In some implementations, a thickness of insulation layer 210 may be in a range from approximately 5 nm to approximately 50 µm, such as 1 µm.

Figure 2G:
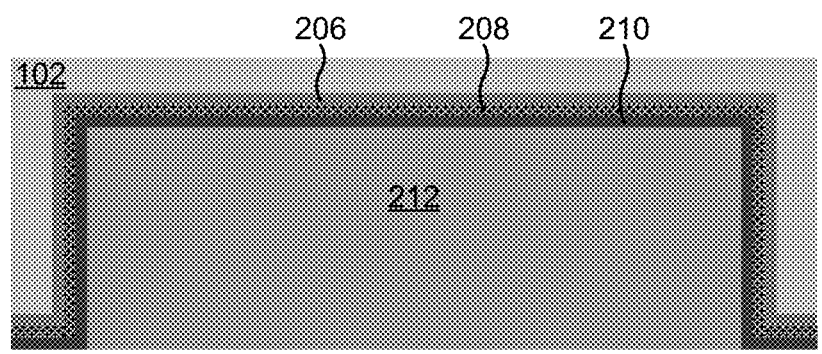

As shown in FIG. 2G, an insulation material 212 is provided on insulation layer 210 such that insulation material 212 fills cavity 204. In some implementations, insulation material 212 may be deposited on the back side of semiconductor substrate 102 such that insulation material 212 fills cavity 204 and is present on other regions of the back side of semiconductor substrate 102 outside of cavity 204. In such a case, as shown in FIG. 2G, planarization may be performed, a result of which leaves cavity 204 filled with insulation material 212, while insulation material 212 on the other regions of semiconductor substrate 102 is removed. In some implementations, insulation material 212 may comprise, for example, silicon oxide or another dielectric material. In some implementations, insulation material 212 may comprise the same type of material as insulation layer 206.

Figure 2H:
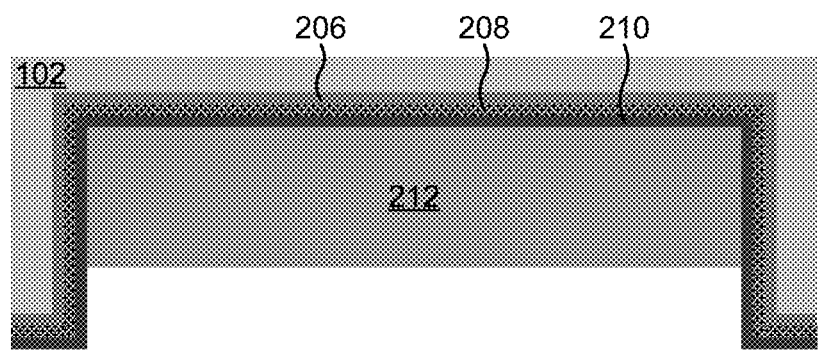

As shown in FIG. 2H, a recess etch can be performed in order to reduce a thickness of insulation material 212 within cavity 204. In some implementations, the recess etch may be performed using a wet selective etching process, a dry selective etching process, and/or the like.

Figure 2I:
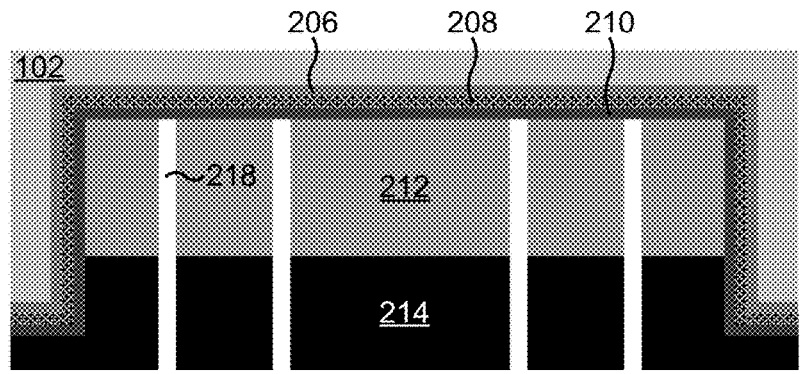

As shown in FIG. 2I, a mask 214 (e.g., a lithographic mask), including one or more openings, can be applied to the back side of semiconductor substrate 102. As further shown, one or more trenches 218 may be etched in insulation material 212 via the one or more openings. In some implementations, the one or more trenches 218 may be formed in order to provide stress reduction in semiconductor chip 200 (e.g., stress resulting from coefficient of thermal expansion (CTE) mismatch of materials of semiconductor chip 200).

In some implementations, a depth of the one or more trenches 218 may be in a range from approximately 500 nm to approximately 2 mm, such as 300 µm. In some implementations, the depth of the one or more trenches 218 may extend to insulation layer 210 (i.e., the depth may extend through insulation material 212 and stop at insulation layer 210). In some implementations, the etch stop at insulation layer 210 may be achieved using a selective etching process that etches insulation material 212, but does not etch insulation layer 210. Alternatively, in some implementations, the depth of the one or more trenches 218 may not extend through insulation material 212. In some implementations, a width or length of the one or more trenches 218 may be in a range from approximately 100 nm to approximately 50 µm, such as 1 µm. In some implementations, a given trench may be as long as a width of the resonator (e.g., in a direction out of the plane of the page of FIG. 2I). In other words, the one or more trenches 218 may have a length that spans cavity 204, in some implementations.

Figure 2J:
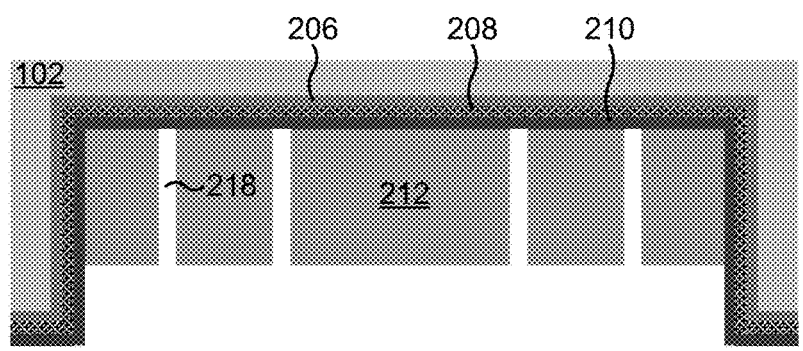

Notably, while four trenches 218 are illustrated in semiconductor chip 200, in practice, any number of trenches 218 may be formed. For example, in some implementations, up to 50 trenches 218 may be formed. Further, formation of the one or more trenches 218 is optional and, in some implementations, no trenches 218 may be formed (in which case the above-described processing steps associated with etching the one or more trenches 218 are not needed). As shown in FIG. 2J, mask 214 is removed after the one or more trenches 218 are etched.

Figure 2K:
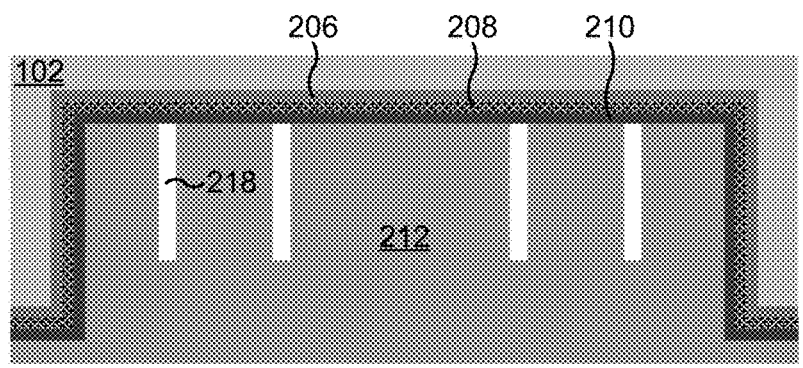

As shown in FIG. 2K, additional insulation material 212 is deposited. In some implementations, the deposition of the additional insulation material 212 may be an anisotropic deposition, so that insulation material 212 grows in a non-conformal manner: growing primarily in a vertical direction and closing the one or more trenches 218 without filling the one or more trenches 218, thereby forming one or more regions in cavity 204 in which insulation material 212 is not present (i.e., one or more voids). This type of growth can be achieved using a plasma-based oxide deposition, in some implementations.

Figure 2L:
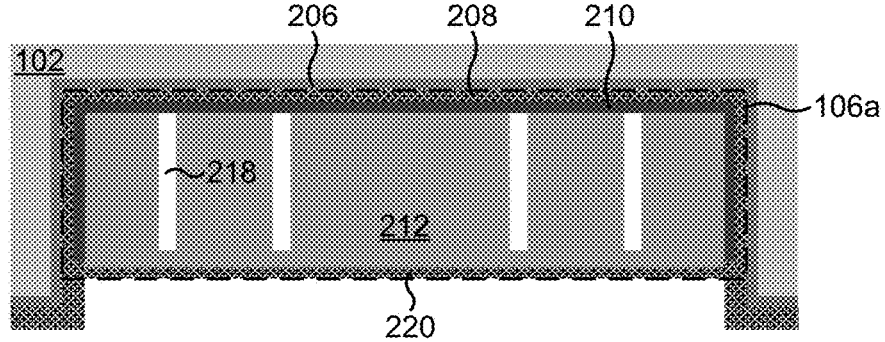

As shown in FIG. 2L, an etch is performed in order to etch away insulation layer 210 and insulation material 212 near edges of cavity 204 such that metal layer 208 is exposed at the edges of cavity 204. As shown, this etch also reduces a thickness of insulation material 212 over the one or more voids provided by the one or more trenches 218 (if present), but does not reopen the one or more trenches 218.

Next, metal layer 220 is deposited on insulation material 212 and the exposed portions of metal layer 208. In some implementations, metal layer 220 may comprise a metal or a metallic material, such as copper, aluminum, tantalum, tungsten, titanium, silver, gold, and/or the like. In some implementations, metal layer 220 comprises the same material as metal layer 208. As described below, metal layer 220 may form another portion of resonator body 106a. In some implementations, a thickness of metal layer 220 may be in a range from approximately 50 nm to approximately 50 µm, such as 1 µm.

As a result of the deposition of metal layer 220, metal layer 208 and metal layer 220 form a metallic body that is at least partially filled with a dielectric material (e.g., insulation material 212). Thus, metal layer 208 and metal layer 220 form resonator body 106a within semiconductor substrate 102, as indicated in FIG. 2L.

Figure 2M:
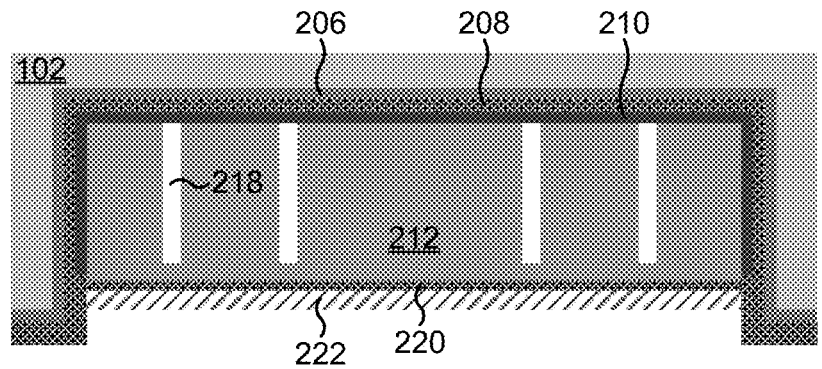

As shown in FIG. 2M, a sealing layer 222 can be applied on metal layer 220. In some implementations, sealing layer 222 may comprise poly silicon, or another type of material capable of sealing or protecting metal layer 220. In some implementations, a thickness of sealing layer 222 may be in a range from approximately 500 nm to approximately 200 µm, such as 20 µm. In some implementations, a thickness of sealing layer 222 may be selected such that an exposed surface of sealing layer 222, after formation and planarization, is approximately flush with an unetched portion of the backside of semiconductor substrate 102, as shown in FIG. 2M.

Figure 2N:
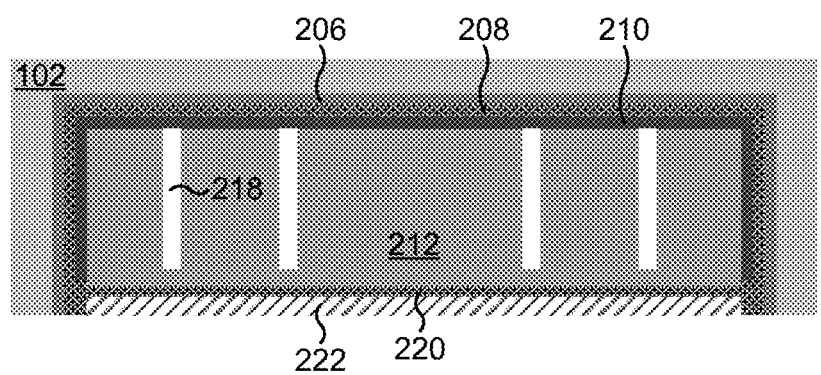

As shown in FIG. 2N, portions of metal layer 220, portions of metal layer 208, and portions of insulation layer 206 can be removed such that a back surface of semiconductor chip 200 is substantially planar. Notably, removal of these portions of metal layer 220, metal layer 208, and insulation layer 206 is optional.

Figure 2O:
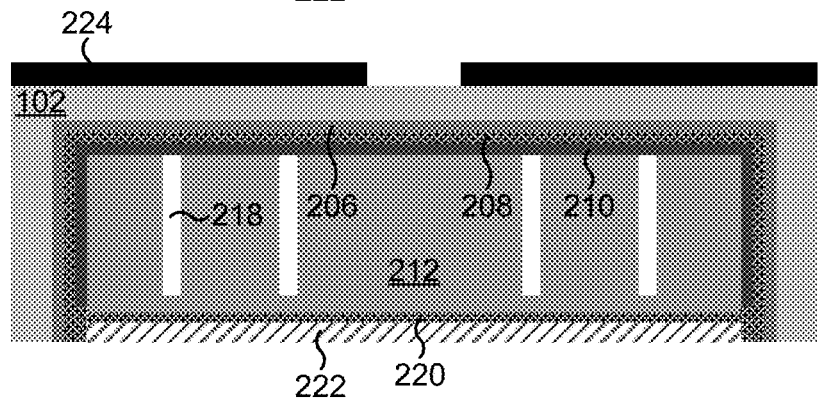

As shown in FIG. 2O, as a first step associated with forming feeding structure 106b, a mask 224 (e.g., a lithographic mask) is formed on the front side of semiconductor substrate 102. As shown, mask 224 includes an opening.

Figure 2P:
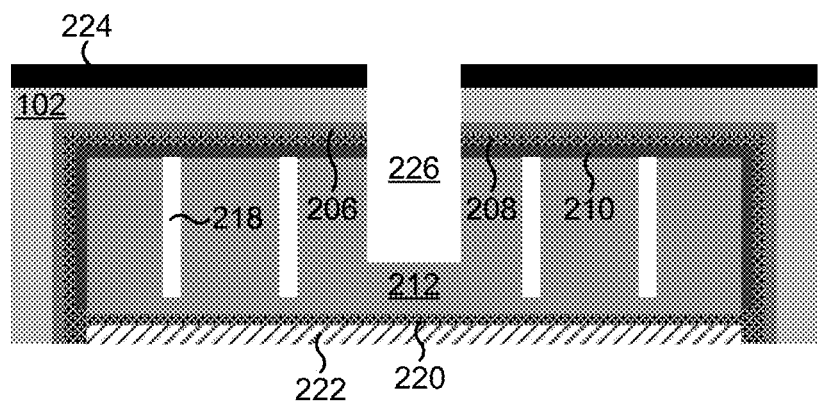

As shown in FIG. 2P, a trench 226 can be etched via the opening in mask 224. As described below, in some implementations, a feeding structure 106b in the form of a protruding electrode (e.g., an electrode that extends into an interior portion of resonator body 106a) may be formed in trench 226. Thus, in some implementations, trench 226 may be etched through semiconductor substrate 102, insulation layer 206, metal layer 208, and insulation layer 210, and may extend into insulation material 212, as shown in FIG. 2P. In some implementations, a depth of trench 226 may be in a range from approximately 100 nm to approximately 2 mm, such as 200 µm. In some implementations, a width or a length of trench 226 may be in a range from approximately 100 nm to approximately 100 µm, such as 5 µm.

Notably, while only one trench 226 is shown, in some implementations, multiple trenches 226 may be formed (via corresponding openings in mask 224), each associated with a different protruding electrode of feeding structure 106b. Further, while feeding structure 106b is described herein as being in the form of a protruding electrode, in some implementations, feeding structure may take a different form, such as a slot antenna that is formed on a front (e.g., top) surface of semiconductor substrate 102.

Figure 2Q:
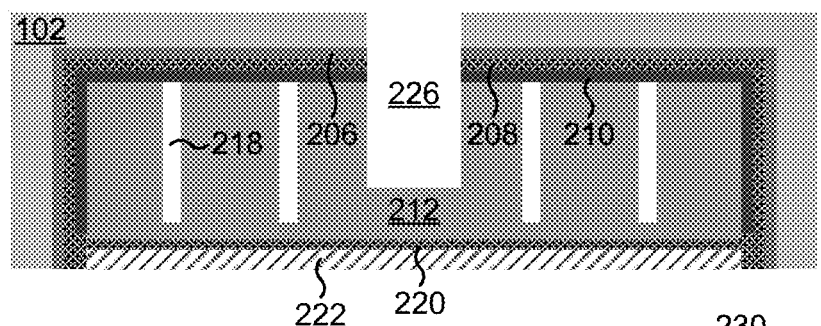
Figure 2R:
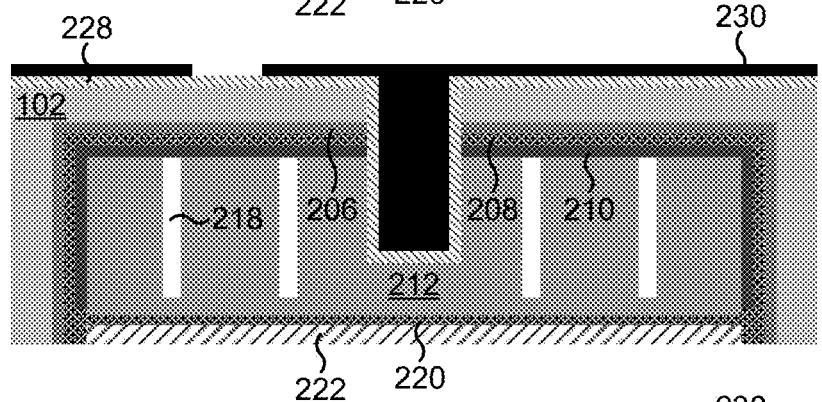

As shown in FIG. 2Q, mask 224 is removed after the etching of trench 226. As shown in FIG. 2R, an insulation layer 228 is deposited on the front side of semiconductor substrate 102, including the surfaces of trench 226. In some implementations, insulation layer 228 may act to prevent contact between semiconductor substrate 102 and other metal layers applied on the front side of semiconductor chip 200, as described below. In some implementations, insulation layer 228 may comprise, for example, silicon oxide or another dielectric material. In some implementations, insulation layer 228 may comprise the same material as insulation layer 206 and/or insulation material 212. In some implementations, a thickness of insulation layer 228 may be in a range from approximately 10 nm to approximately 5 µm, such as 200 nm. As further shown, a mask 230 (e.g., a lithographic mask) is applied on insulation layer 228. As shown, mask 230 includes an opening via which a trench, associated with forming a ground electrode, may be etched, as described below.

Figure 2S:
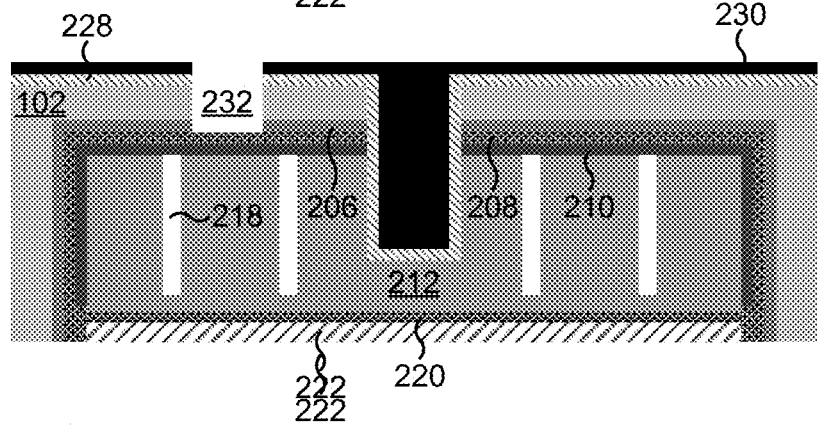
Figure 2T:
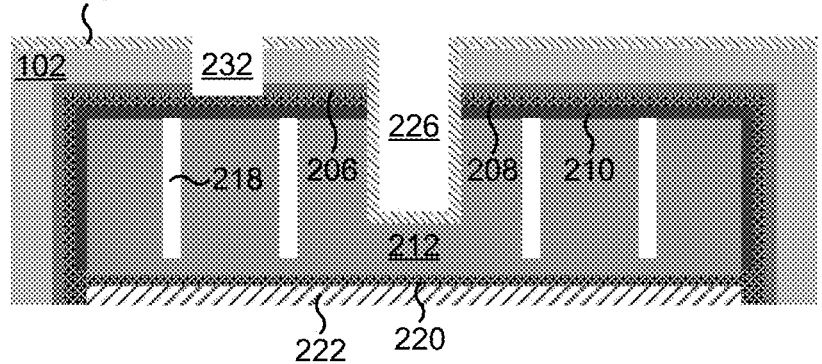

As shown in FIG. 2S, a trench 232 is etched via the opening in mask 230. In some implementations, trench 232 is etched through semiconductor substrate 102 and insulation layer 206. As shown, the etching of trench 232 stops at metal layer 208. In some implementations, a depth of trench 232 may be in a range from approximately 100 nm to approximately 2 mm, such as 50 µm. In some implementations, a width or a length of trench 232 may be in a range from approximately 100 nm to approximately 100 µm, such as 5 µm. As shown in FIG. 2T, mask 230 is removed after trench 232 is etched.

Figure 2U:
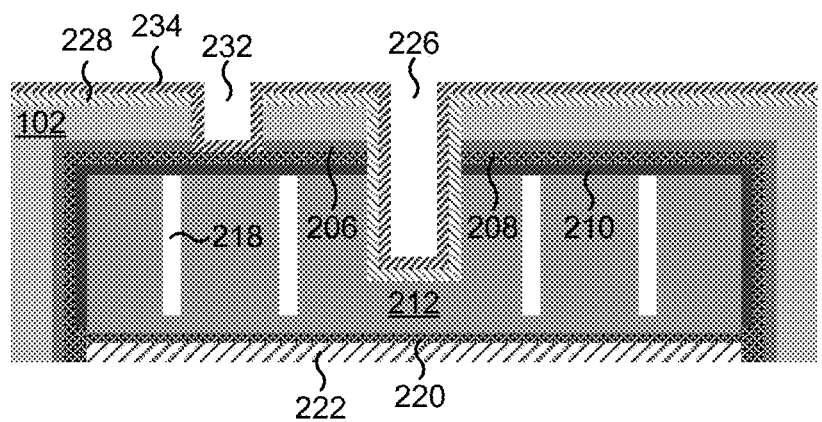

As shown in FIG. 2U, an insulation layer 234 is deposited on insulation layer 228 and on the surfaces that define trench 232. Notably, only insulation layer 234 is present on the surfaces that define trench 232, while both insulation layer 228 and insulation layer 234 are present on other areas on the front side of semiconductor chip 200. In some implementations, insulation layer 234 may comprise, for example, silicon oxide or another dielectric material. In some implementations, insulation layer 234 may comprise the same material as insulation layer 228. In some implementations, a thickness of insulation layer 234 may be in a range from approximately 10 nm to approximately 5 µm, such as 200 nm.

Figure 2V:
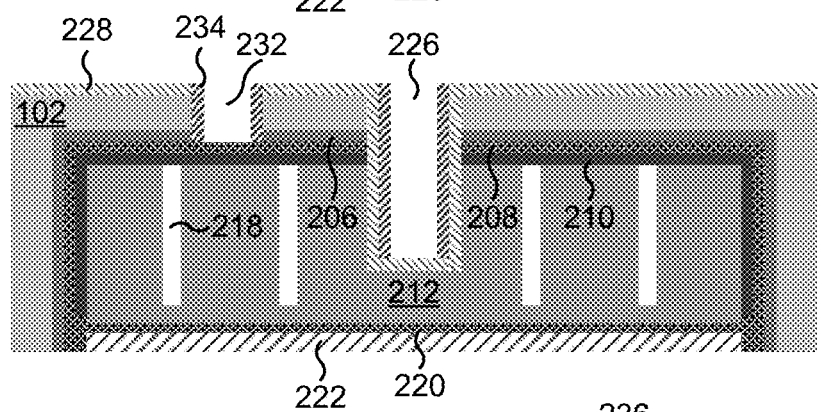

As shown in FIG. 2V, an etch is performed in order to open the bottom surface of trench 232. In some implementations, this etch can be a timed soft anisotropic insulator etch. Notably, as a result of this etching step, insulation layer 234 remains on the sidewalls of trench 232. Further, due to the presence of insulation layer 228 in trench 226 prior to deposition of insulation layer 234, only insulation layer 234 is etched from the bottom surface of trench 226, while insulation layer 228 remains at the bottom surface of trench 226. As such, a protruding electrode and a ground connection can be formed using a single deposition of front side metallization, as described below.

Figure 2W:
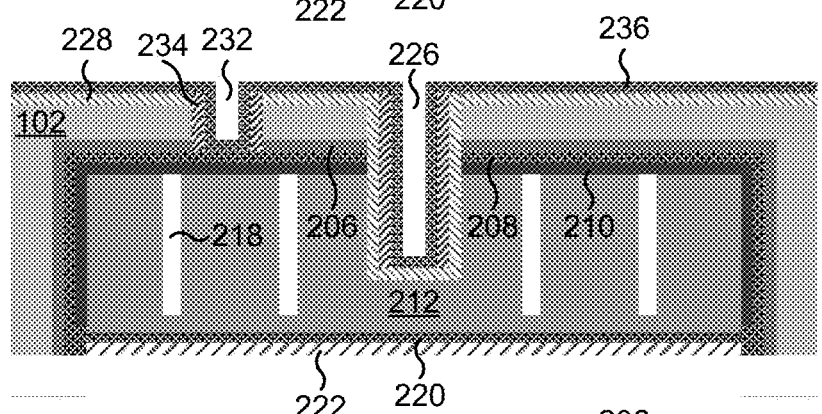

As shown in FIG. 2W, a metal layer 236 is deposited on the front side of semiconductor chip 200. In some implementations, metal layer 236 may comprise a metal or a metallic material, such as copper, aluminum, tantalum, tungsten, titanium, silver, gold, and/or the like. In some implementations, metal layer 236 comprises the same material as metal layer 208 and/or metal layer 220. In some implementations, a thickness of metal layer 236 may be in a range from approximately 100 nm to approximately 50 µm, such as 1 µm.

As shown, metal layer 236 contacts metal layer 208 in trench 232, thereby forming the ground electrode of cavity resonator 106. As further shown, metal layer 236 forms the protruding electrode of feeding structure 106b in trench 226. Notably, the portion of metal layer 236 that forms the protruding electrode in trench 226 is insulated from semiconductor substrate 102 and resonator body 106a (i.e., metal layer 208 and metal layer 220).

Figure 2X:
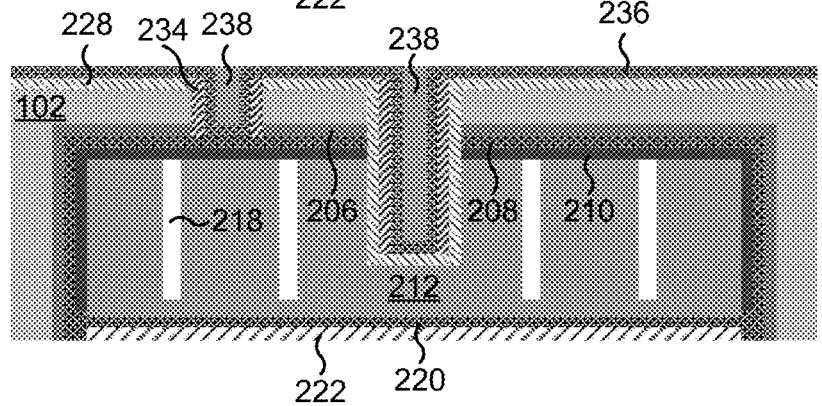

As shown in FIG. 2X, an insulation material 238 is provided on the front side of semiconductor chip 200 such that insulation material 238 fills the remaining empty portions of trench 226 and trench 232. In some implementations, insulation material 238 may be deposited on the front side of semiconductor chip 200 such that insulation material 238 fills trench 226 and trench 232, and is present on other regions of the front side of semiconductor chip 200. In such a case, as shown in FIG. 2X, planarization may be performed, a result of which leaves trench 226 and trench 232 filled with insulation material 238, while insulation material 238 on the other regions of semiconductor chip 200 is removed. In some implementations, insulation material 238 may comprise, for example, silicon oxide, silicon, a combination of silicon and silicon oxide, and/or another type of material.

Figure 2Y:
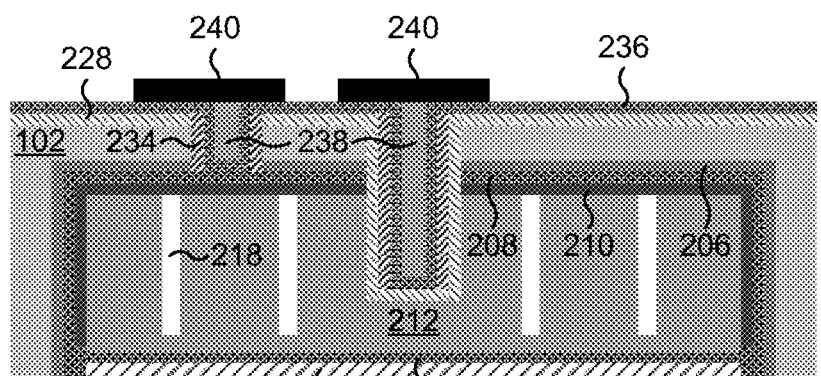
Figure 2Z:
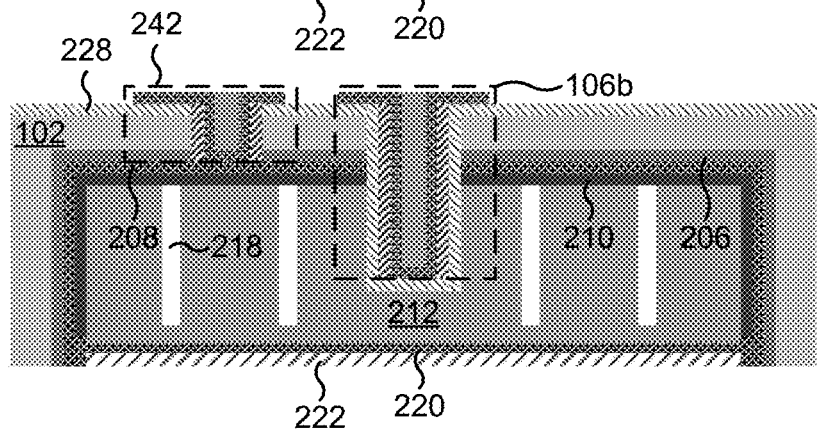
Figure 2A:
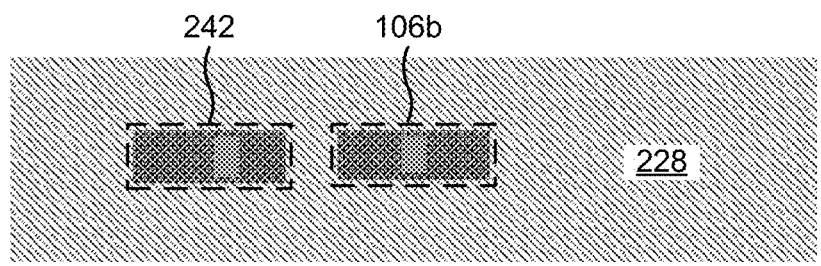
Figure 2B:
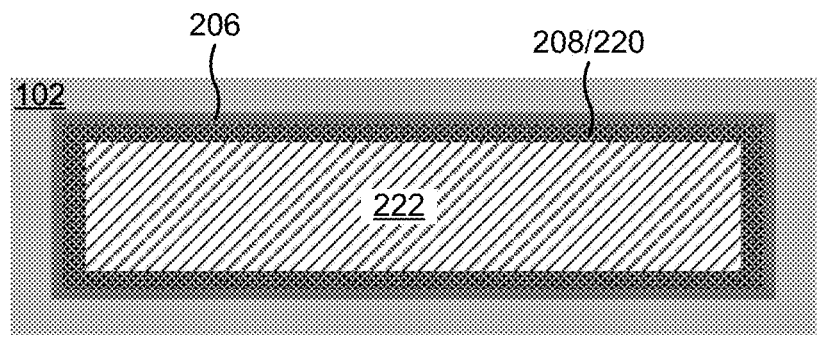

As shown in FIG. 2Y, a mask 240 (e.g., a lithographic mask) is deposited over a portion of metal layer 236 around and within trench 226 (i.e., over the protruding electrode of feeding structure 106b) and a portion of metal layer 236 around and within trench 232 (i.e., over the ground electrode).

As shown in FIG. 2Z, metal layer 236 is etched in order to form feeding structure 106b (e.g., an electrode that extends into an interior portion of resonator body 106a). As further shown, the etching of metal layer 236 also provides a ground electrode 242.

In this way, cavity resonator 106, comprising resonator body 106a and feeding structure 106b, can be integrated with high frequency electrical circuitry 104 in semiconductor substrate 102 of semiconductor chip 200.

FIGS. 2AA and 2BB are an example schematic top and bottom views, respectively, of semiconductor chip 200, provided for illustrative purposes.

Notably, the above described process steps are provided as examples, and other process steps, different process steps, additional process steps, fewer process steps, and/or differently ordered process steps may be performed.

Further, as indicated above, the number and arrangement of components and layers shown in FIGS. 2A-2BB are provided as examples. In practice, semiconductor chip 200 may include additional components and/or layers, fewer components and/or layers, different components and/or layers, differently arranged components and/or layers, differently sized components and/or layers, components and/or layers with different relative sizes, and/or the like, than those shown in FIGS. 2A-2BB.

In some implementations, as described above with regard to semiconductor chip 150, an integrated cavity resonator may be adapted for use in an integrated spectroscopic sensor that requires operation at a frequency in, for example, the THz range.

Figure 3A:
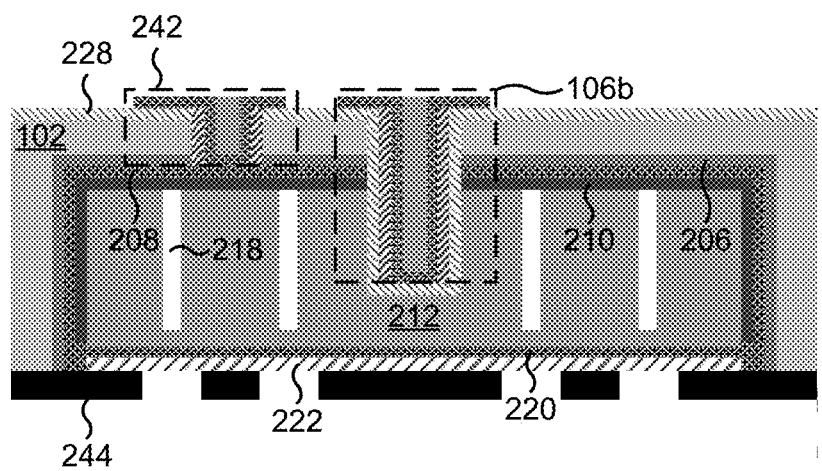
FIGS. 3A-3E are diagrams associated with an example implementation of an integrated cavity resonator in a semiconductor substrate of a semiconductor chip that is adapted for use in a spectroscopic sensor.
Figure 3B:
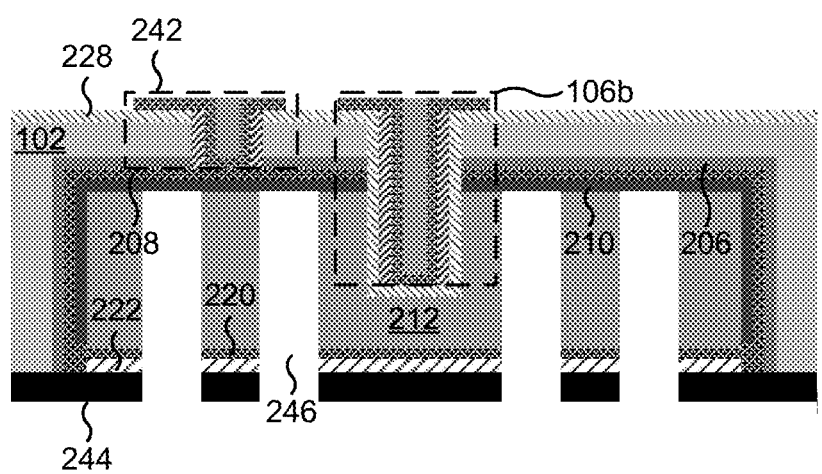
Figure 3C:
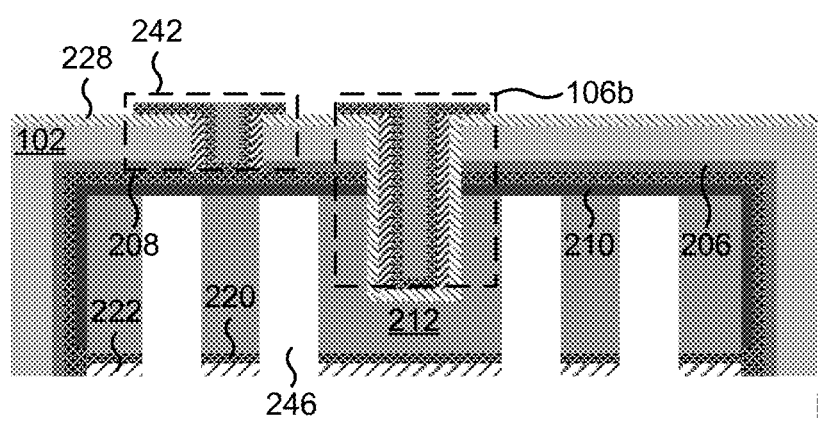

FIGS. 3A-3E are diagrams associated with an example implementation 300 of semiconductor chip 150. The device associated with FIGS. 3A-3E is herein referred to as semiconductor chip 300. FIGS. 3A-3C depict example process steps for forming openings that allow a medium to enter cavity resonator 106 in semiconductor substrate 102 of semiconductor chip 300. In some implementations, manufacture of semiconductor chip 300 can include performing process steps described above in association with FIGS. 2A-2Z. Thus, for the purposes of FIGS. 3A-3C, it is assumed that the process steps associated with FIGS. 2A-2Z have been performed.

As shown in FIG. 3A, a mask 244 (e.g., a lithographic mask), including one or more openings, is applied to the back side of semiconductor substrate 102.

As shown in FIG. 3B, one or more trenches 246 are etched through sealing layer 222, metal layer 220, and insulation material 212 via the one or more openings. In some implementations, as shown, the etching of trenches 246 may stop at insulation layer 210. In the case of semiconductor chip 300, trenches 246 are formed in order to permit a medium to enter the interior portion of resonator body 106a in association with providing spectroscopic sensing functionality.

In some implementations, a depth of the one or more trenches 246 may be in a range from approximately 50 nm to approximately 2 mm, such as 500 μm. In some implementations, the depth of the one or more trenches 246 may extend to insulation layer 210, as described above. In some implementations, the etch stop at insulation layer 210 may be achieved using a selective etching process that etches sealing layer 222, metal layer 220, and insulation material 212, but does not etch insulation layer 210. Alternatively, in some implementations, the depth of the one or more trenches 246 may not extend through insulation material 212. In some implementations, a width or length of the one or more trenches 246 may be in a range from approximately 50 nm to approximately 50 μm, such as 1 μm. In some implementations, a lateral etch may be performed within the one or more trenches 246 such that insulation material 212 is laterally etched (e.g., in order to widen the one or more trenches 246.

Notably, while four trenches 246 are illustrated in semiconductor chip 300, in practice, any number of trenches 246 may be formed. For example, in some implementations 50 trenches 246 may be formed. As shown in FIG. 3C, mask 244 is removed after the one or more trenches 246 are etched.

Figure 3D:
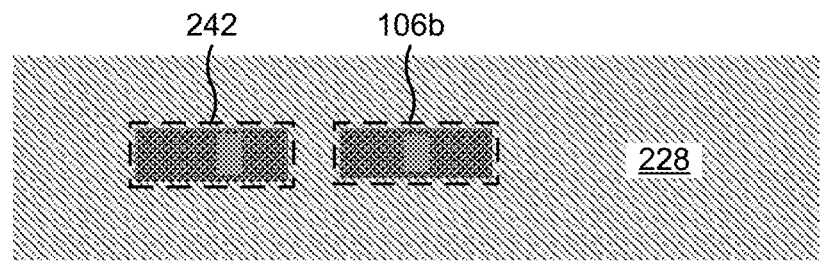
Figure 3E:
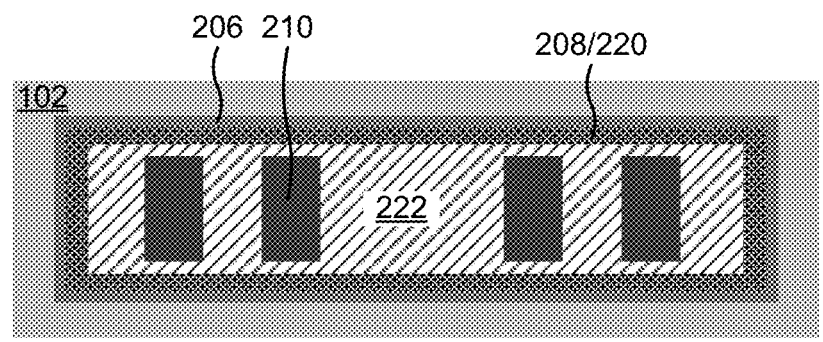

FIGS. 3D and 3E are an example schematic top and bottom views, respectively, of semiconductor chip 300, provided for illustrative purposes.

In this way, one or more openings allow a medium (e.g., a gas, a liquid, and/or the like) to enter the interior portion of resonator body 106a of cavity resonator 106 in order to enable functionality associated with detecting or sensing the medium (e.g., in parts per billion, parts per million) by means of THz spectroscopy.

Notably, the above described process steps are provided as examples, and other process steps, different process steps, additional process steps, fewer process steps, and/or differently ordered process steps may be performed.

Further, as indicated above, the number and arrangement of components and layers shown in FIGS. 3A-3E are provided as examples. In practice, semiconductor chip 300 may include additional components and/or layers, fewer components and/or layers, different components and/or layers, differently arranged components and/or layers, differently sized components and/or layers, components and/or layers with different relative sizes, and/or the like, than those shown in FIGS. 3A-3E.

Figure 4:
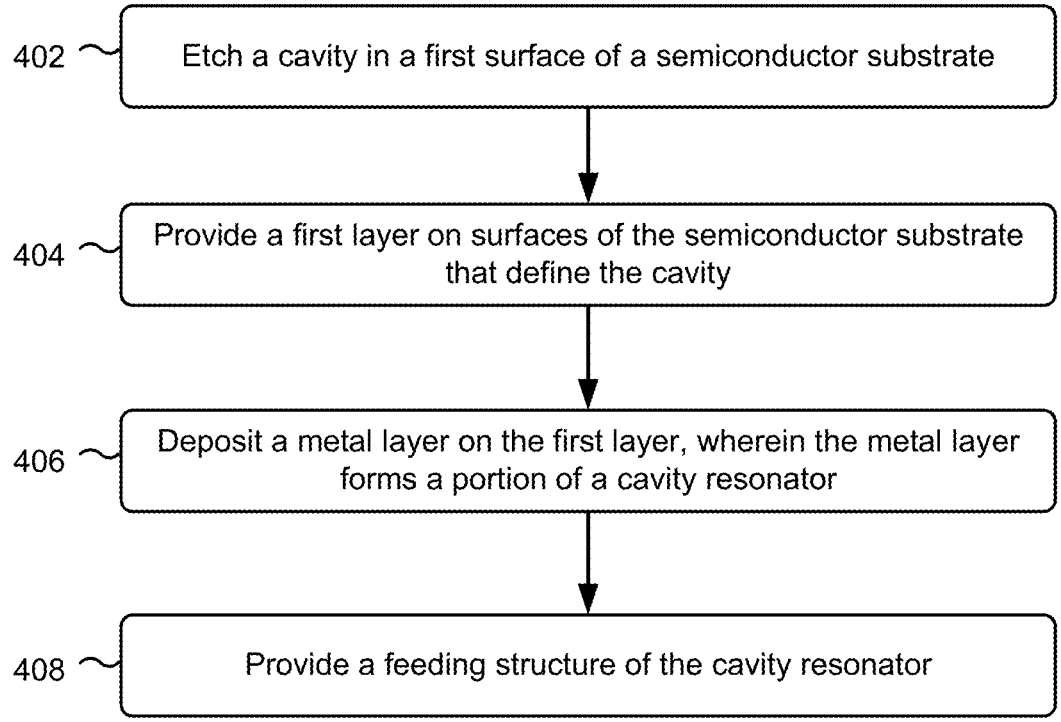
FIG. 4 is a flow chart of an example process for providing an integrated cavity resonator in a semiconductor substrate of a semiconductor chip.

FIG. 4 is a flow chart of an example process 400 for providing an integrated cavity resonator 106 in a semiconductor substrate 102 of a semiconductor chip (e.g., semiconductor chip 100, 150, 200, 300, and/or the like).

As shown in FIG. 4, process 400 may include etching a cavity in a first surface of a semiconductor substrate (block 402). For example, cavity 204 may be etched in a back side (e.g., bottom) surface of semiconductor substrate 102, as described above.

As further shown in FIG. 4, process 400 may include providing a first layer on surfaces of the semiconductor substrate that define the cavity (block 404). For example, insulation layer 206 (e.g., a layer that prevents interaction of semiconductor substrate 102 and a metal layer) may be provided on surfaces of semiconductor substrate 102 that define cavity 204, as described above.

As shown in FIG. 4, process 400 may include depositing a metal layer on the first layer, wherein the metal layer forms a portion of a body of the cavity resonator (block 406). For example, metal layer 208 may be deposited on insulation layer 206, wherein metal layer 208 forms a portion of resonator body 106a of cavity resonator 106, as described above.

As shown in FIG. 4, process 400 may include providing a feeding structure of the cavity resonator (block 408). For example, feeding structure 106b of cavity resonator 106 may be provided, as described above.

Process 400 may include additional operations, such as any single operation or any combination of operations described below and/or in connection with one or more other processes described elsewhere herein.

In some implementations, process 400 may include providing an insulation material on the metal layer. For example, insulation layer 210 may be provided on metal layer 208, as described above.

In some implementations, process 400 may include at least partially filling an interior portion of the body with a dielectric material. For example, the interior portion of resonator body 106a (e.g., the portion of cavity resonator 106 defined by metal layer 208) may be at least partially filled with insulation material 212, as described above.

In some implementations, the feeding structure may be provided on a second surface of the semiconductor substrate. For example, feeding structure 106b may be provided on the front side (e.g., top) surface of semiconductor substrate 102, as described above.

In some implementations, high frequency electrical circuitry may be partially provided on the second surface of the semiconductor substrate before the cavity is etched in the first surface of the semiconductor substrate. For example, high frequency electrical circuitry 104 may be at least partially provided on the front side surface of semiconductor substrate 102 before cavity 204 is etched in the back side surface of semiconductor substrate 102, as described above. In some implementations, feeding structure may include an electrode that extends into an interior portion of resonator body 106a, or may include a slot antenna.

In some implementations, providing the feeding structure may include etching at least one opening that extends through the first layer and the metal layer. For example, feeding structure 106b may be provided based on etching trench 226 that extends through insulation layer 206 and metal layer 208, as described above.

In some implementations, at least one opening to an interior portion of the body of the cavity resonator may be etched. For example, one or more trenches 246 (e.g., openings that connect to an interior portion of resonator body 106a) may be etched, as described above.

In some implementations, a second metal layer that forms another portion of the body of the cavity resonator may be deposited. For example, metal layer 220 that forms another portion of resonator body 106a may be deposited, as described above.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A semiconductor chip, comprising:
   high frequency electrical circuitry; and
   a cavity resonator integrated with the high frequency electrical circuitry in a semiconductor substrate of the semiconductor chip,
   the cavity resonator comprising:
      a resonator body in a cavity in the semiconductor substrate of the semiconductor chip,
         wherein the resonator body comprises a metal layer and at least one opening to an interior portion of the resonator body, and
      a feeding structure electrically connected to the high frequency electrical circuitry.

2. The semiconductor chip of claim 1, further comprising an insulation layer between the resonator body and the semiconductor substrate within the cavity.

3. The semiconductor chip of claim 1, wherein an interior portion of the cavity is at least partially filled with a dielectric material.

4. The semiconductor chip of claim 1, wherein the feeding structure comprises at least one of:
   an electrode that extends into the interior portion of the resonator body, or
   a slot antenna.

5. The semiconductor chip of claim 1, wherein the interior portion of the resonator body includes at least one region in which a dielectric material is not present.

6. The semiconductor chip of claim 1, wherein the cavity resonator is arranged on an opposite side of the semiconductor substrate from the high frequency electrical circuitry.

7. The semiconductor chip of claim 1, wherein an operable frequency range of a circuit formed by the high frequency electrical circuitry and the cavity resonator is between approximately 10 gigahertz (GHz) and approximately 10 terahertz (THz).

8. The semiconductor chip of claim 1, wherein the high frequency electrical circuitry and the cavity resonator form a high frequency oscillation circuit.

9. The semiconductor chip of claim 1, wherein the high frequency electrical circuitry and the cavity resonator are included in a spectroscopic sensor, and
   wherein the at least one opening allows a medium to enter the interior portion of the resonator body.

10. A method for providing a cavity resonator, the method comprising:
   providing electrical circuitry on a first surface of a semiconductor substrate;
   etching a cavity in a second surface of the semiconductor substrate;
   providing a first layer on third surfaces of the semiconductor substrate that define the cavity;
   depositing a metal layer on the first layer at least within the cavity,
      wherein the metal layer forms a portion of a body of the cavity resonator; and
   providing a feeding structure of the cavity resonator,
      wherein providing the feeding structure comprises:
         etching an opening in the first surface of the semiconductor substrate that extends through the first layer and the metal layer, and
         providing an electrode in the opening.

11. The method of claim 10, further comprising providing an insulation material on the metal layer.

12. The method of claim 10, further comprising at least partially filling an interior portion of the body with a dielectric material.

13. The method of claim 10, wherein providing the electrode comprises:
   depositing another metal layer on the first surface of the semiconductor substrate and in the opening.

14. The method of claim 10, wherein the electrical circuitry is provided on the first surface of the semiconductor substrate before the cavity is etched in the second surface of the semiconductor substrate.

15. The method of claim 10, further comprising:
providing another feeding structure that comprises:
another electrode that extends into an interior portion of the body of the cavity resonator; or
a slot antenna.

16. The method of claim 10, wherein the metal layer is a first metal layer; and
wherein the method further comprises:
depositing a second metal layer that forms another portion of the body of the cavity resonator.

17. The method of claim 10, further comprising:
etching at least another opening to an interior portion of the body of the cavity resonator.

18. A cavity resonator, comprising:
a resonator body comprising an interior portion that is at least partially filled with an insulation material,
wherein the resonator body is arranged in a cavity in a semiconductor substrate;
an insulation layer arranged between the resonator body and a surface of the semiconductor substrate that defines the cavity; and
a feeding structure formed in the semiconductor substrate to feed a high frequency signal to the cavity resonator,
wherein the feeding structure is connected to high frequency electrical circuitry that is arranged on the semiconductor substrate, and
wherein the high frequency electrical circuitry and the cavity resonator are integrated in a same integrated circuit.

19. A semiconductor chip, comprising:
high frequency electrical circuitry; and
a cavity resonator integrated with the high frequency electrical circuitry in a semiconductor substrate of the semiconductor chip,
wherein an operable frequency range of a circuit formed by the high frequency electrical circuitry and the cavity resonator is between approximately 10 gigahertz (GHz) and approximately 10 terahertz (THz), and
wherein the cavity resonator comprises:
a resonator body in a cavity in the semiconductor substrate of the semiconductor chip,
wherein the resonator body comprises a metal layer, and
a feeding structure electrically connected to the high frequency electrical circuitry.

20. The semiconductor chip of claim 19, wherein the high frequency electrical circuitry and the cavity resonator are included in a spectroscopic sensor.

* * * * *